(12) United States Patent
Smith et al.

(10) Patent No.: US 6,824,399 B2
(45) Date of Patent: Nov. 30, 2004

(54) DEVICE AND SYSTEM FOR RECESSING A FASTENER ON A PRINTED WIRE BOARD

(75) Inventors: Paul J. Smith, San Diego, CA (US); Aleksandr Manulis, San Diego, CA (US)

(73) Assignee: Kyocera Wireless Corp., San Diego, CA (US)

( * ) Notice: Subject to any disclaimer, the term of this patent is extended or adjusted under 35 U.S.C. 154(b) by 0 days.

(21) Appl. No.: 10/067,447

(22) Filed: Feb. 4, 2002

(65) Prior Publication Data

US 2003/0148642 A1 Aug. 7, 2003

(51) Int. Cl.[7] .............................................. H01R 12/00
(52) U.S. Cl. ..................... 439/82; 439/573; 439/943; 411/85
(58) Field of Search .................... 439/82, 876, 943, 439/564, 567, 573; 411/85, 84, 112, 537, 379, 380, 381, 382, 352, 353, 111, 113

(56) References Cited

U.S. PATENT DOCUMENTS

| | | | | |
|---|---|---|---|---|
| 2,486,411 A | * | 11/1949 | Huelster | 411/551 |
| 2,922,211 A | * | 1/1960 | Boyd | 411/551 |
| 3,792,412 A | * | 2/1974 | Madden | 361/774 |
| 4,585,295 A | * | 4/1986 | Ackerman | 439/857 |
| 4,721,470 A | * | 1/1988 | Humphrey | 439/55 |
| 4,827,609 A | * | 5/1989 | Kawecki | 29/832 |
| 4,932,876 A | * | 6/1990 | Seidler | 439/630 |
| 5,073,118 A | * | 12/1991 | Grabbe et al. | 361/771 |
| 5,154,621 A | * | 10/1992 | Legrady | 439/75 |
| 5,169,322 A | * | 12/1992 | Frantz et al. | 439/378 |
| 5,239,135 A | * | 8/1993 | Phillips, II | 174/267 |
| 5,616,052 A | * | 4/1997 | Pan et al. | 439/573 |
| 5,688,093 A | * | 11/1997 | Bowers | 411/552 |
| 5,803,766 A | * | 9/1998 | Yang | 439/567 |
| 6,206,726 B1 | * | 3/2001 | Takahashi et al. | 439/573 |
| 6,375,499 B1 | * | 4/2002 | Lin | 439/573 |

* cited by examiner

*Primary Examiner*—Tho D. Ta
*Assistant Examiner*—Edwin A. Leon

(57) ABSTRACT

A system and a device are provided for recessing a fastener on a printed wire board (PWB). The system includes a PWB having a fastener hole, a top surface, and a bottom surface. The system further comprises a recessed fastener adapter which includes a board interface for interfacing the adapter with the PWB at the fastener hole and a fastener head engaging surface for accepting and recessing a fastener head. The board interface is generally in the shape of a tube. The walls of the tube may be circular, curved or straight in a cross-section perpendicular to the long axis of the tube. The tube has an exterior surface, which is connected to the PWB at the fastener hole. The fastener head engaging surface is formed by a closed end on the tube having an opening or bore. In one version of the adapter, a flange extends radially outward from the exterior surface of the tube. To install the adapter, the flange upper surface (facing away from the closed end of the tube) is placed against the bottom surface of the PWB at a fastener hole. A solder bond can be used to connect the adapter to the PWB. An adhesive material is used if greater strength is needed. The fastener shaft passes through the opening in the closed end of the tube and the fastener head rests against the inside surface of the closed end of the tube.

18 Claims, 3 Drawing Sheets

DEVICE AND SYSTEM FOR RECESSING A FASTENER ON A PRINTED WIRE BOARD

BACKGROUND OF THE INVENTION

1. Field of the Invention

This invention generally relates to fastening devices and, more particularly, to a device and system for recessing a fastener on a printed wire board (PWB).

2. Description of the Related Art

FIGS. 1A and 1B are drawings depicting fasteners on a PWB (prior art). FIGS. 1A and 1B are not drawn to scale. Fasteners, such as screws, are typically used to install a PWB in a structure, for example, the chassis of a wireless communications device. As shown in FIG. 1A, fastener heads can protrude above the surface of a PWB. Such protrusions can cause potential interference problems with the installation and layout of components to be connected to the PWB or with other PWBs or components near the PWB. As shown in FIG. 1B, a countersink hole can be provided at the location of the fastener on the PWB to recess the fastener head and prevent fasteners from protruding above the surface of the PWB. Typically, countersinking is possible with PWBs having a thickness greater than approximately one millimeter.

Due to advances in PWB fabrication techniques, PWBs with thicknesses of less than approximately one millimeter are now available. The use of these thinner PWBs is desirable, since these PWBs, by virtue of their own reduced size and weight, reduce the size and weight of devices into which the PWBs are installed. Unfortunately, countersinking is typically not possible using conventional designs, layouts, and materials for PWBs having a thickness less than approximately one millimeter. Therefore, the reduced size and weight advantages of the thinner PWBs are offset by potential interference problems related to protruding fasteners.

For thicker PWBs, there are still disadvantages to countersinking. Contersinking holes in a PWB involves extra process steps that typically must be performed in small batches, or individually, eliminating the possibility of processing multiple boards in one operation, as is possible if only through-holes are required. For example, when through-holes are used, a group of PWBs having the same fastener hole locations can be stacked together, aligned, and drilled as a group, reducing the time and cost to produce holes necessary for fastening the PWBs.

Conventionally, fasteners are allowed to protrude above the surface of PWBs with thicknesses less than approximately one millimeter. As a result, users and manufacturers of devices containing these PWBs have suffered from the consequences of protruding fasteners.

It would be advantageous if a fastener for a PWB with a thickness of less than approximately one millimeter could be fully or partially recessed below the surface of the PWB. It also would be advantageous if countersinking could be eliminated for PWBs with thicknesses greater than approximately one millimeter, allowing the use of standard through-holes for fasteners.

SUMMARY OF THE INVENTION

The present invention addresses the problem of interferences associated with the use of fasteners on a printed wire board (PWB). The invention also addresses the use of countersinking operations that preclude more efficient methods for drilling fastener holes in PWBs. The invention addresses these problems by attaching a recessed fastener adapter to a PWB at a standard (non-countersunk) through-hole in the PWB. A fastener is inserted in the adapter and the shaft of the fastener passes through the adapter (allowing the fastener to be used to attach the PWB to a structure). The adapter secures and recesses the head of the fastener fully or partially below the top surface of the PWB. The adapter itself either does not cause interferences on the PWB, or causes interferences, the extent of which are less than the interferences that would be caused by not using the adapter or are acceptable to obtain the benefit of eliminating counter-sink holes.

Accordingly, a system is provided for recessing a fastener on a PWB. The system includes a PWB having a fastener hole, a top surface, and a bottom surface. The system further comprises a recessed fastener adapter that includes a board interface for interfacing the adapter with the PWB at the fastener hole and a fastener head engaging surface for accepting and recessing a fastener head. The fastener head engaging surface recesses a fastener head at least partially below the PWB top surface.

The board interface is generally in the shape of a tube. The tube is not necessarily cylindrical. That is, the walls of the tube may be circular, curved or straight in a cross-section perpendicular to the long axis of the tube. The tube has an exterior surface that is connected to the PWB at the fastener hole. The fastener head engaging surface is formed by a closed end on the tube having an opening or bore. A fastener is inserted into the other (open) end of the tube, the shaft of the fastener passes through the opening in the closed end, and the head of the fastener rests against the closed end.

In one version of the adapter, a flange extends radially outward from the exterior surface of the tube. The flange is located at or near the open end of the tube. The flange has a disc-like shape with an upper surface (facing away from the closed end of the tube). To install the adapter, the upper surface is placed against the bottom surface of a PWB at a fastener hole. The shape of the flange outline and the configuration of the flange upper surface can vary as long as the upper surface properly seats against the PWB bottom surface. The opening in the closed end of the tube and the fastener hole are aligned so that a fastener can be inserted from the top side of the PWB through the fastener hole. The fastener shaft passes through the opening in the closed end of the tube and the fastener head rests against the inside surface of the closed end of the tube. The head of the fastener is either fully or partially contained in the tube and is, therefore, either fully or partially recessed below the top surface of the PWB. The degree of the recess can be adjusted so that the fastener head does not cause interferences on the PWB, so that fastener head interferences are less than would be caused by the fastener head without the adapter, or so that fastener head interferences are acceptable to obtain the benefit of eliminating counter-sink holes.

In one aspect of the present invention, a solder bond is used to connect the tube to the PWB, but if the bond is not strong enough, an adhesive material is used is connect the tube to the PWB. Accordingly, the surfaces of the tube in contact with the PWB (in this case, the upper surface of the flange) are made of materials that accept an adhesive material or are suitable for solder bonding.

To use a recessed fastener adapter to secure a PWB to the structure of a device such as the chassis of a wireless communications device, the adapter is installed on the PWB and a fastener is inserted into and through the adapter, as described above. The fastener, in turn, is connected to the structure of the device. The connection can take a number of forms including screw threads engaging the structure or a rivet expanding in the structure. As the fastener is connected to the structure, the fastener head advances toward the structure, contacts the recessed fastener adapter, and pulls the recessed fastener adapter toward the structure. The pressure from the pull is transferred to the PWB, securing the PWB to the device structure in the desired position.

The use of the present invention system enables fasteners to be recessed on PWBs with thicknesses less than approximately one millimeter. For PWBs with thicknesses greater than approximately one millimeter, the use of the present invention system eliminates countersinking at PWB fastener holes and allows the use of through-holes which can be drilled in a more efficient manner than countersink holes. Additional details of the above-mentioned system and a device for recessing a fastener on a PWB are presented below.

DETAILED DESCRIPTION OF THE PREFERRED EMBODIMENTS

Figure 1A:
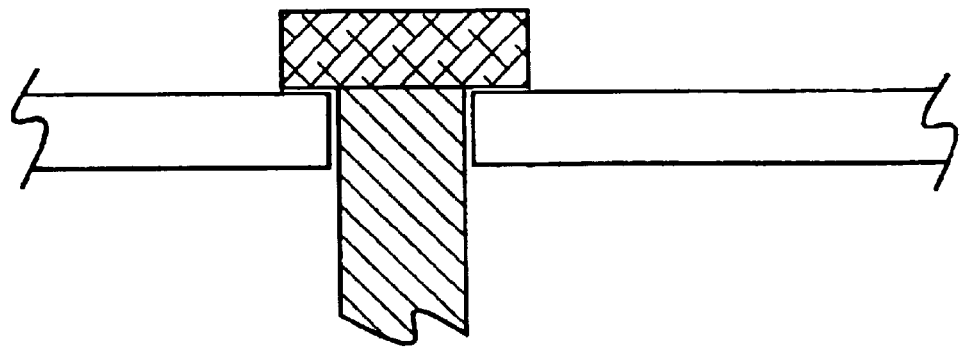
FIGS. 1A and 1B are drawings depicting fasteners on a PWB (prior art).
Figure 1B:
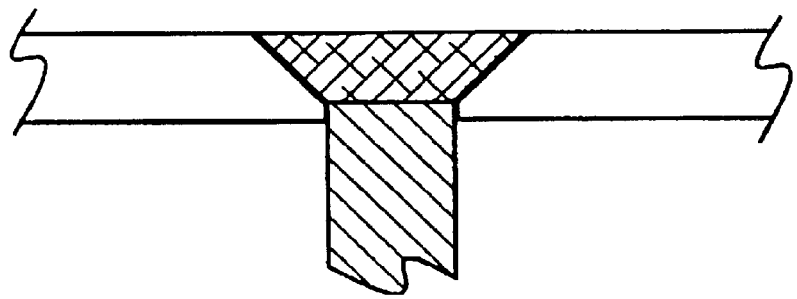
Figure 2A:
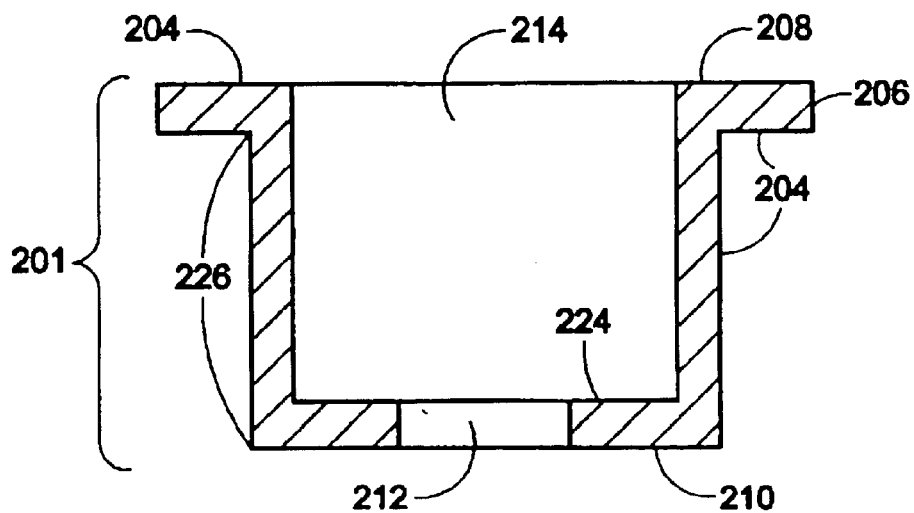
FIGS. 2A and 2B are partial cross-sectional views of a first aspect of the present invention device and system for recessing a fastener on a printed wire board (PWB).
Figure 2B:
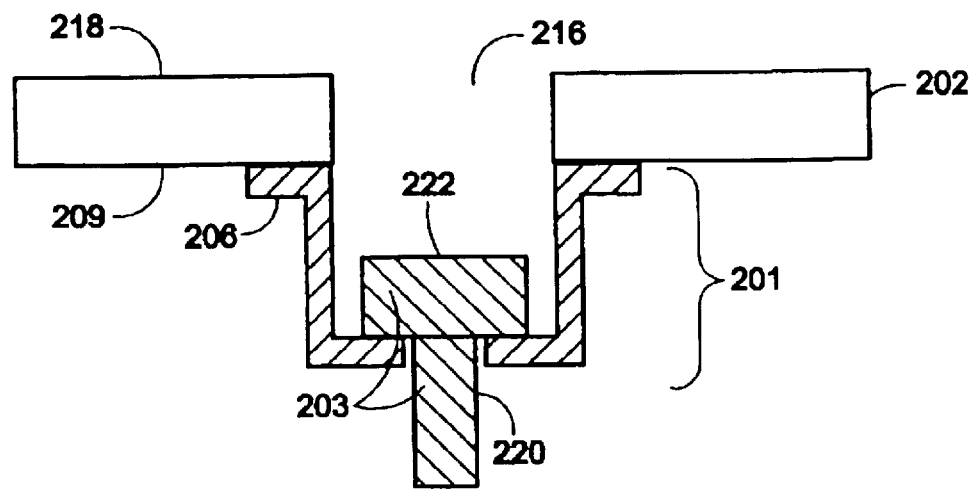
Figure 3A:
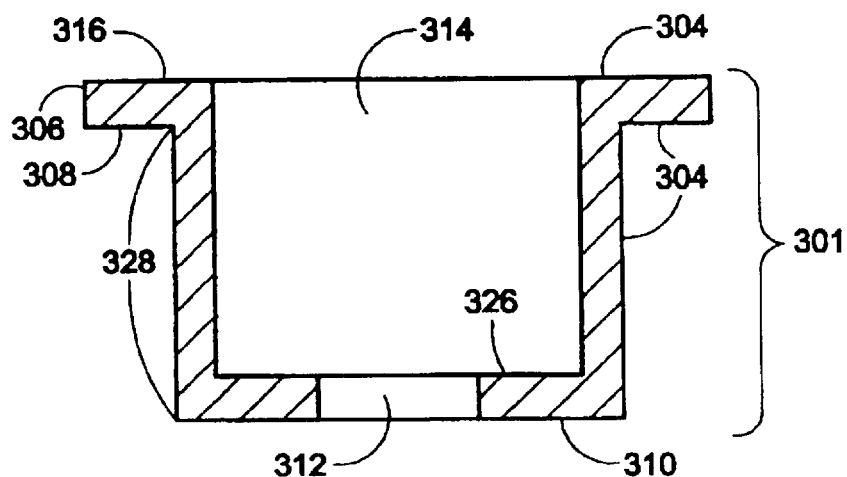
FIGS. 3A and 3B are partial cross-sectional views of a second aspect of the present invention device and system for recessing a fastener on a PWB.
Figure 3B:
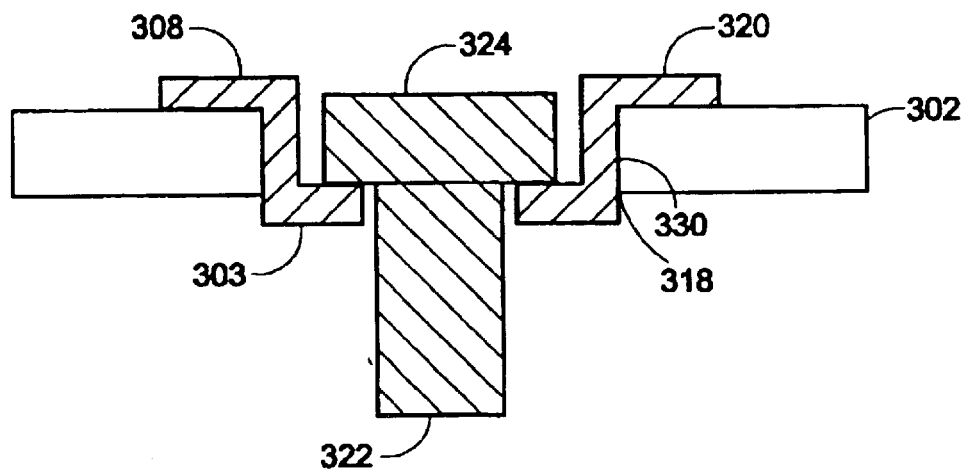

FIGS. 2A and 2B are partial cross-sectional views of a first aspect of the present invention device and system for recessing a fastener on a printed wire board (PWB). FIGS. 3A and 3B are partial cross-sectional views of a second aspect of the present invention device and system for recessing a fastener on a PWB. Note that FIGS. 2A, 2B, 3A, and 3B, as well as FIGS. 4A and 4B below, are not necessarily to scale. FIGS. 2A, 2B, 3A, 3B, 4A, and 4B show the present invention device and system in a partial cross-sectional view along the long axis of the invention device. FIGS. 2A and 3A depict the present invention device and FIGS. 2B and 3B depict the present invention system. In FIGS. 2A and 2B, the recessed fastener adapter 201 is generally in the shape of a tube with straight, non-tapering sides. The same holds true for recessed fastener adapter 301 is FIGS. 3A and 3B. A cross-section perpendicular to the long axes of the recessed fastener adapters 201 and 301 can be circular (that is, the adapters 201 and 301 are cylindrical tubes) or can be composed of any combination of curved or straight lines. For example, the tube could have a square cross-section. The adapters 201 and 301 cross-sections and the configurations of the adapters 201 and 301 sides can be selected to accommodate a number of parameters including techniques for fabricating the adapter or the requirements of the particular PWB 202 or 302 installation, such as the shapes or sizes of the fasteners 203 and 303.

In FIG. 2A, the recessed fastener adapter 201 has an exterior surface 204 with a flange 206 that extends radially outward from the exterior surface 204. The flange 206 has an upper surface 208 for interfacing with the PWB 202. The shape of the flange 206 outline and the configuration of the upper surface 208 can vary, as long as the upper surface 208 properly seats against the PWB bottom surface 209. The recessed fastener adapter 201 has a closed end 210 with an adapter hole 212 and also has an open end 214. In FIGS. 2A and 2B, the flange 206 is flush with the open end 214. However, the flange 206 can be located further down the length of the recessed fastener adapter 201 toward the closed end 210, so that a portion of the recessed fastener adapter 201 extends beyond the flange upper surface 208 as a lip (not shown). Consideration of a lip on the recessed fastener adapter 201 is discussed below.

The invention system includes the recessed fastener adapter 201 and the PWB 202 with a fastener hole 216. In FIG. 2B, the recessed fastener adapter 201 is installed on the PWB 202. The flange upper surface 208 is placed against the PWB bottom surface 209. The adapter hole 212 and the fastener hole 216 are aligned so that the fastener 203 can be inserted from the PWB top surface 218 through the fastener hole 216 and into the recessed fastener adapter 201. If the recessed fastener adapter 201 has a lip as described in the previous paragraph, the lip fits inside the fastener hole 216. Consideration of potential interferences caused by the lip extending above the PWB top surface 218 is presented following the discussion of FIGS. 4A and 4B below. The fastener shaft 220 passes through the adapter hole 212 and the fastener head 222 rests against the recessed fastener adapter inside surface 224. The fastener head 222 is either fully or partially contained in the recessed fastener adapter 201 and is, therefore, either fully or partially recessed below PWB top surface 218. The amount of the recess can be selected by varying the recessed fastener adapter height 226 and/or the height of the fastener head 222. In FIG. 2B, fastener head 222 is shown fully recessed below PWB top surface 218. Consideration of potential interferences caused by the fastener head 222 is presented following the discussion of FIGS. 4A and 4B below.

The recessed fastener adapter 201 is attached to the PWB bottom surface 209 using an adhesive material or through a solder bond. Accordingly, the flange upper surface 208 is made of materials that accept an adhesive material or are suitable for solder bonding. In one aspect of the present invention, solder is used to connect the recessed fastener adapter 201 to the PWB 202, because the solder bond will provide a conductive path to the PWB 202. In situations where greater strength is required, an adhesive material is used to connect the recessed fastener adapter 201 to the PWB 202.

FIGS. 3A and 3B are drawings depicting a second aspect of the present invention device and system for recessing a fastener on a PWB. In FIG. 3A, the recessed fastener adapter 301 has an exterior surface 304 with a flange 306 that extends radially outward from the exterior surface 304. The flange 306 has a lower surface 308 for interfacing with the PWB 302. The recessed fastener adapter 301 has a closed end 310 with an adapter hole 312 and also has an open end 314. The flange 306 would typically be located flush with the open end 314, as shown in FIGS. 3A and 3B, to eliminate a lip (not shown) that would extend beyond the flange upper surface 316. Consideration of a lip on the recessed fastener adapter 301 is discussed below.

The invention system includes the recessed fastener adapter 301 and the PWB 302 with a fastener hole 318. In FIG. 3B, the recessed fastener adapter 301 is installed on the PWB 302. The closed end 310 is inserted through the fastener hole 318 until the flange lower surface 308 is resting against the PWB top surface 320. Consideration of potential interferences caused by the thickness of the flange 306 (that is, the thickness of the material between the flange upper surface 316 and the flange lower surface 308) and a lip (if any) extending beyond the flange upper surface 316 is presented following the discussion of FIGS. 4A and 4B below. The fastener shaft 322 passes through the adapter hole 312 and the fastener head 324 rests against the recessed fastener adapter inside surface 326. The fastener head 324 is either fully or partially contained in the recessed fastener adapter 301 and is, therefore, either fully or partially recessed below the PWB top surface 320. The amount of the recess can be selected by varying the recessed fastener adapter height 328 and/or the height of the fastener head 324. In FIG. 3B, fastener head 324 is shown partially recessed below PWB top surface 320. Consideration of potential interferences caused by the fastener head 324 are presented following the discussion of FIGS. 4A and 4B below.

The recessed fastener adapter 301 is attached to the PWB 302 by adhesive material, solder bonding, a compression fit, or a combination thereof. Accordingly, the flange lower surface 308 and the portions of the exterior surface 304 in contact with the PWB 302 are made of materials that accept an adhesive material or are suitable for solder bonding for those cases in which adhesive materials or solder bonding are used. For those cases in which a compression fit is used, the recessed fastener adapter 301 is sized so that those portions of the exterior surface 304 in contact with the inside surface 330 of the fastener hole 318 form a compressive fit with the inside surface 330. In one aspect of the present invention, a solder bond is used when connecting the recessed fastener adapter 301 to the PWB 302, because the solder bond will provide a conductive path to the PWB 302. The tube exterior surface 304 also can be grooved (not shown) to facilitate the use of adhesive material, solder bonding or a compression fit. The grooves can take a variety of shapes, but in one configuration, the grooves are parallel to the long axis of the recessed fastener adapter 301.

Figure 4A:
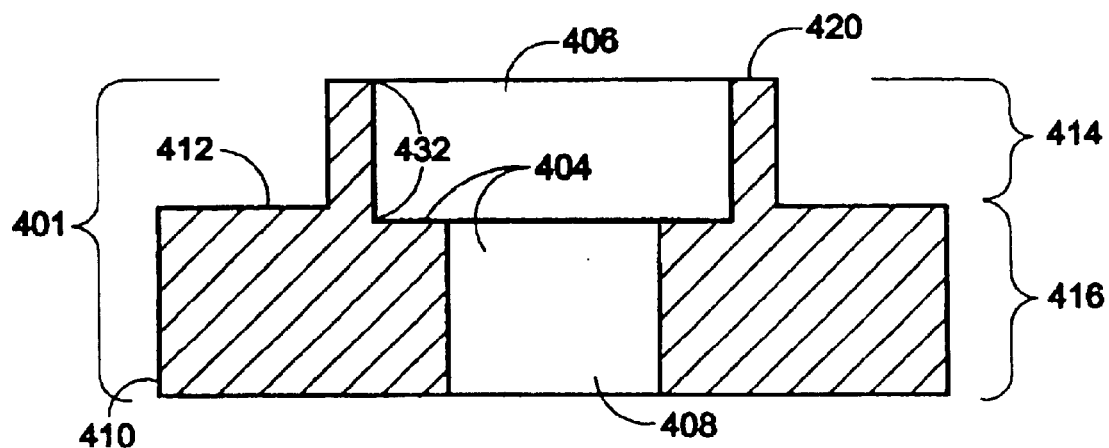
FIGS. 4A and 4B are partial cross-sectional views of a third aspect of the present invention device and system for recessing a fastener on a PWB.
Figure 4B:
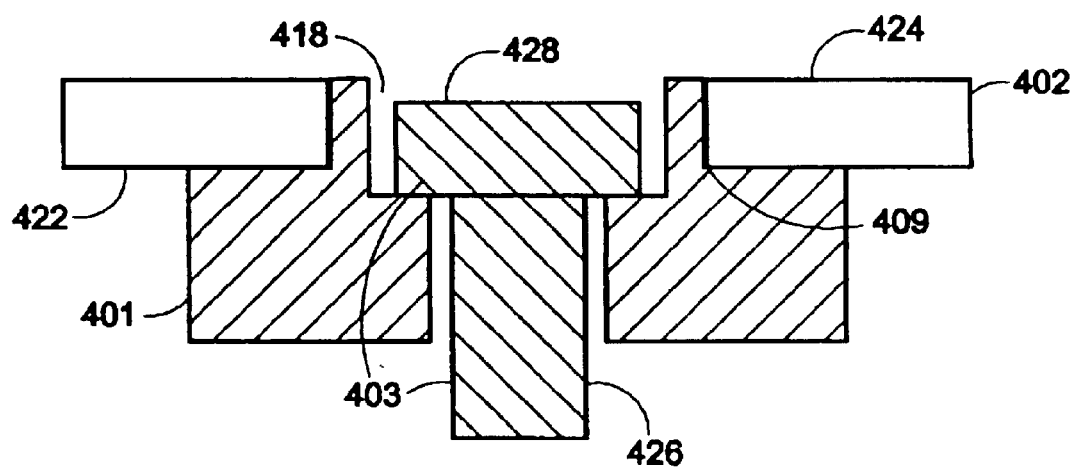

FIGS. 4A and 4B are partial cross-sectional views of a third aspect of the present invention device and system for recessing a fastener on a PWB. FIG. 4A depicts the invention device and FIG. 4B depicts the invention system. The recessed fastener adapter 401 in FIGS. 4A and 4B is generally in the shape of a tube or a solid tubular piece having sides with straight, non-tapering segments. The cross-section perpendicular to the long axis of the recessed fastener adapter 401 can be circular (that is, the adapter 401 is a cylindrical tube) or can be composed of any combination of curved or straight lines. For example, the tube can have a square cross-section. The adapter 401 cross-section and the configuration of the adapter 401 sides can be selected to accommodate a number of parameters including techniques for fabricating the adapter or the requirements of the particular PWB 402 installation, such as the shape or size of the fastener 403. For the presentation below, the recessed fastener adapter 401 is assumed to be a solid, cylindrical tube with the modifications shown and described.

The recessed fastener adapter 401 has a stepped bore 404 along its long axis. The bore upper section 406 has a larger diameter than the bore lower section 408. The bore step 409 is formed by the juncture of the bore upper section 406 and the bore lower section 408. FIGS. 4A and 4B show the recessed fastener adapter 401 with a protrusion on an exterior surface 410 in the form of a step 412. The step 412 is formed by the intersection of a top section 414 and a bottom section 416. The top section 414 has a smaller outside diameter than the bottom section 416. As described below, the step 410 is used to interface the recessed fastener adapter 401 with the PWB 402. In another variation of the present invention, the recessed fastener adapter 401 is a uniform cylinder (that is, the outside diameter does not vary). This variation is not shown. For the uniform cylinder variation of the recessed fastener adapter 401, a protrusion for interfacing the recessed fastener adapter 401 with the PWB 402 can be formed by a ring of material or flange extending from the exterior surface of the recessed fastener adapter.

The invention system includes the recessed fastener adapter 401 and the PWB 402 with a fastener hole 418. In FIG. 4B, the recessed fastener adapter 401 is installed on the PWB 402. The top end 420 is inserted through the fastener hole 418 until the step 412 (or the ring of material or flange in the uniform cylinder variation of the recessed fastener adapter 401 described above) is resting against the PWB bottom surface 422. In FIG. 4B, the top end 420 is shown approximately flush with the PWB top surface 424. The top end 420 can be recessed below the PWB top surface 424 or can protrude above the PWB top surface 424. Consideration of potential interferences caused by the top section 414 or the top end 420 is presented following the discussion of FIGS. 4A and 4B below.

In the uniform cylinder variation of recessed fastener adapter 401, the top end (the equivalent of top end 420) is inserted through the fastener hole 418 until the top end is above, flush with, or below the PWB top surface 424. As noted above, consideration of potential interferences is presented following the discussion of FIGS. 4A and 4B below.

The fastener shaft 426 passes through the stepped bore 404 and the fastener head 428 rests against the bore step 409. The fastener head 428 is either fully or partially contained in the recessed fastener adapter 401 and is, therefore, either fully or partially recessed below PWB top surface 424. The amount of the recess can be selected by varying the bore upper section length 432 and/or the height of the fastener head 428. In FIG. 4B, fastener head 428 is shown approximately flush with the top end 420 and the PWB top surface 424. Consideration of potential interferences caused by the fastener head 428 is presented following the discussion of FIGS. 4A and 4B below.

The recessed fastener adapter 401 is attached to the PWB 402 by adhesive material, solder bonding, a compression fit, or a combination thereof. Accordingly, the portions of the exterior surface 410 in contact with the PWB 402 are made of materials that accept an adhesive material or are suitable for solder bonding for those cases in which adhesive materials or solder bonding are used. For those cases in which a compression fit is used, the top section 414 is sized so that the exterior surface 410 at the top section 414 forms a compressive fit when the recessed fastener adapter 401 is inserted into the fastener hole 418. In one aspect of the present invention, a solder bond is included when connecting the recessed fastener adapter 401 to the PWB 402, because the solder bond will provide a conductive path to the PWB 402. The tube exterior surface 410, particularly in the top section 414, also can be grooved (not shown) to facilitate the use of adhesive material, solder bonding or a compression fit. For the uniform cylinder variation of recessed fastener adapter 401, the exterior surface also can be grooved. The grooves can take a variety of shapes, but in one configuration, the grooves are parallel to the long axis of the recessed fastener adapter 401.

In general, the use of the present invention system meets at least one of the following criterion: cause no interference on the PWBs, cause less interference on the PWBs than is caused by not using the present invention system, or cause interferences on the PWBs that are acceptable to obtain the benefit of eliminating counter-sink holes in the PWBs. Specifically, the following parameters are selected with respect to the three above-mentioned criterion: the height of a lip (if any) on recessed fastener adapter 201, the recessing of fastener head 222, the thickness of flange 306, the height of a lip (if any) on recessed fastener adapter 301, the recessing of fastener head 324, the protrusion of top surface 420 and top section 414 (and their equivalents in the uniform cylinder variation of recessed fastener adapter 401) above PWB 402, and the recessing of fastener head 428.

In some aspects of the invention system, the protrusion of recessed fastener adapters and fasteners above the subject PWBs is more difficult or even impossible to avoid. For example, with very thin PWBs, the connection of the recessed fastener adapter to the PWB may lack sufficient strength if the recessed fastener adapter does not protrude above the PWB. In other applications, the protrusion of the adapter or fastener above the PWB is not considered a problem, because interferences on the PWB are not of great concern.

The following discussion applies to FIGS. 2B, 3B, and 4B and describes the general function of the present invention system. To use a recessed fastener adapter to secure a PWB to the structure of a device such as the chassis of a wireless communications device, the adapter is installed on the PWB and a fastener is inserted into and through the adapter, as described above. The fastener, in turn, is connected to the structure of the device. The connection can take a number of forms including screw threads engaging the structure or a rivet expanding in the structure. As the fastener is connected to the structure, the fastener head advances toward the structure, contacts the recessed fastener adapter, and pulls the recessed fastener adapter toward the structure. The pressure from the pull is transferred to the PWB, securing the PWB to the device structure in the desired position.

A device and system are provided for recessing a fastener on a PWB. The present invention, however, is not limited to PWBs. The present invention also can be used in other applications where various boards, covers or other components are secured to a structure by fasteners, and it is desirable or necessary to limit protrusion of the fasteners or eliminate countersinking. The present invention system has been described using screws and rivets as fasteners. Other types of fasteners such as bolts or fastening systems such as those employing adhesive materials can be used with the invention system. Other variations and embodiments will occur to those skilled in the art.

We claim:

1. A recessed fastener adapter device for recessing a fastener on a printed wire board (PWB), the device comprising:
    a board interface for interfacing the adapter device with the PWB at a fastener hole, wherein the fastener hole is a non-countersunk through-hole, wherein the board interface interfaces with the PWB at the fastener hole and includes a top surface; and,
    a fastener head engaging surface for accepting and recessing a fastener head having a top surface, wherein the fastener head engaging surface engages a fastener head and recesses a fastener head, and
    wherein neither the top surface of the board interface nor the top surface of the fastener head protrudes from the PWB top surface.

2. The device of claim 1 wherein the board interface includes a tube with an exterior surface, wherein a flange extends radially outward from the exterior surface, and wherein the flange has an upper surface for interfacing with a PWB.

3. The device of claim 2 wherein the fastener head engaging surface includes the tube having a closed end with a bore for engaging a fastener head and passing a fastener shaft attached to a fastener head.

4. The device of claim 1 wherein the board interface includes a tube with an exterior surface for interfacing with a PWB; and, wherein the fastener head engaging surface includes the tube having a closed end with a stepped bore for engaging a fastener head and passing a fastener shaft attached to a fastener head.

5. The device of claim 4 wherein the tube exterior surface is grooved.

6. The device of claim 4 wherein the tube exterior surface has a protrusion for interfacing with a PVVB.

7. The device of claim 6 wherein a step in the tube exterior surface forms the protrusion.

8. A system for recessing a fastener on a printed wire board (PWB), the system comprising:
    the PWB having a fastener hole, a top surface, and a bottom surface; and
    a recessed fastener adapter including:
        a board interface for interfacing the recessed fastener adapted with the PWB at the fastener hole, wherein the fastener hole is a non-countersunk through-hole, wherein the board interface interfaces with the PWB at the fastener hole and includes a top surface; and,
        a fastener head engaging surface for accepting and recessing a fastener head having a top surface, wherein the fastener head engaging surface engages a fastener head and recesses a fastener head, and
        wherein neither the top surface of the board interface nor the top surface of the fastener head protrudes from the PWB surface.

9. The system of claim 8 wherein the board interface has an exterior surface for interfacing the recessed fastener adapter with the PWB at the fastener hole, and wherein at least part of the exterior surface is in compression where interfacing with the PWB.

10. The system of claim 8 wherein the board interface has an exterior surface for interfacing the recessed fastener adapter with the PWB at the fastener hole, wherein the exterior surface accepts an adhesive material for interfacing with the PWB, and wherein the exterior surface is attached to the PWB with an adhesive material.

11. The system of claim 8 wherein the board interface has an exterior surface for interfacing the recessed fastener adapter with the PWB at the fastener hole, wherein the exterior surface is a material conducive to solder bonding, and wherein the exterior surface is bonded to the PWB with solder.

12. The system of claim 8 wherein the board interface has an exterior surface for interfacing the recessed fastener adapter with the PWB at the fastener hole, and wherein at least part of the exterior surface is grooved.

13. The system of claim 8 wherein the board interface includes a tube with an exterior surface, wherein a flange extends radially outward from the exterior surface, wherein the flange has an upper surface for interfacing with the PWB, and wherein the flange upper surface interfaces with the PWB bottom surface at the PWB fastening hole.

14. The device of claim 13 wherein the fastener head engaging surface includes the tube having a closed end with a bore for engaging a fastener head and passing a fastener shaft attached to a fastener head.

15. The device of claim 8 wherein the board interface includes a tube with an exterior surface for interfacing with the PWB; and, wherein the fastener head engaging surface includes the tube having a closed end with a stepped bore for engaging a fastener head and passing a fastener shaft attached to a fastener head.

16. The system of claim 15 wherein the tube is inserted into the PWB fastener hole and wherein the tube exterior surface interfaces with sides of the PWB hole.

17. The system of claim 16 wherein the tube exterior surface has a protrusion for interfacing with the PWB, and wherein the protrusion interfaces with the PWB bottom surface.

18. The system of claim 17 wherein a step in the tube exterior surface forms the protrusion.

\* \* \* \* \*